US008634215B2

(12) United States Patent
Deboy

(10) Patent No.: US 8,634,215 B2
(45) Date of Patent: Jan. 21, 2014

(54) RECTIFIER CIRCUIT WITH A VOLTAGE SENSOR

(75) Inventor: Gerald Deboy, Klagenfurt (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/419,623

(22) Filed: Mar. 14, 2012

(65) Prior Publication Data

US 2012/0170339 A1 Jul. 5, 2012

Related U.S. Application Data

(62) Division of application No. 12/194,345, filed on Aug. 19, 2008, now Pat. No. 8,164,931.

(51) Int. Cl.
*H02H 7/125* (2006.01)

(52) U.S. Cl.
USPC .......................................... 363/52

(58) Field of Classification Search
USPC ............ 363/21.06, 21.14, 50, 52, 53, 84, 89, 363/125, 127
See application file for complete search history.

(56) References Cited

U.S. PATENT DOCUMENTS

| 5,777,502 | A * | 7/1998 | Chen et al. ............. 327/309 |
| 6,806,533 | B2 | 10/2004 | Henninger et al. |
| 6,833,584 | B2 | 12/2004 | Henninger et al. |
| 6,914,297 | B2 | 7/2005 | Deboy et al. |
| 7,602,154 | B2 | 10/2009 | Fu et al. |
| 2008/0309320 | A1 * | 12/2008 | Chu et al. ............. 324/119 |
| 2009/0244932 | A1 | 10/2009 | Lin |

FOREIGN PATENT DOCUMENTS

| DE | 19958234 | 6/2001 |
| DE | 10234493 | 2/2004 |

OTHER PUBLICATIONS

Office Action mailed Jul. 7, 2011 in U.S. Appl. No. 12/194,345.

* cited by examiner

*Primary Examiner* — Matthew Nguyen
(74) *Attorney, Agent, or Firm* — Dicke, Billig & Czaja, PLLC

(57) ABSTRACT

A rectifier circuit with a synchronously controlled semiconductor element. The rectifier circuit includes at least one field effect transistor with a control electrode and two switching electrodes. The control electrode operates the reverse state and the forward state between the switching electrodes. At least one driver, which cooperates with a voltage sensor of the field effect transistor, controls this to the forward state during the diode operating state of the field effect transistor. The voltage sensor includes a sensor output capacitance that forms a non-linear voltage divider with an external reference capacitance.

6 Claims, 8 Drawing Sheets

US 8,634,215 B2

RECTIFIER CIRCUIT WITH A VOLTAGE SENSOR

CROSS-REFERENCE TO RELATED APPLICATION

This application is a divisional of U.S. patent application Ser. No. 12/194,345, filed on Aug. 19, 2008, the contents of which are incorporated herein by reference.

BACKGROUND

The application relates to a rectifier circuit with at least one field effect transistor which includes a control electrode and two switching electrodes. The control electrode thereby operates the field effect transistor from a reverse state to an opening state and vice versa between the two switching electrodes and vice versa. The rectifier circuit furthermore includes one driver which cooperates with a voltage sensor of the field effect transistor and which operates this to the forward state with the diode operating state of the field effect transistor.

During the switching from the reverse state into the forward state, a residual voltage remains in the diode operation, which voltage can lead to large forward losses with synchronous rectifier circuits. It is therefore necessary to provide at least one field effect transistor which switches to the forward state in a timely manner. However, this requires a measuring technique which signals a driver of the field effect transistor in a timely manner that it shall connect and pass from the diode forward operation to the channel conducting state. However, in this transition phase, voltage peaks paired with very high voltage and current changes per time unit dv/dt and di/dt can occur, which are a multiple of the voltage to be realized in the diode forward operation.

During a measurement of the voltage in the diode opening operation between source and drain by using an integrated circuit, the integrated measuring circuit thus has to have a high electrical strength at the inlet, so that it can recognize the diode opening operation safely despite high voltage peaks and is protected against overvoltage peaks.

Another solution consists in cutting the high voltage part at the drain of a field effect transistor via a diode, so that the input for the integrated measuring circuit is drawn to a reference potential. But as soon as the voltage drops below 5 V, the diode becomes conducting, so that it is possible to use an integrated measuring circuit with an input with a low electrical strength, so as to detect the voltage in the diode opening operation at such a field effect transistor in a timely manner.

However, the last-mentioned possibility requires additional components as for example diodes, so as to ensure that the integrated circuit is protected from occurring voltage peaks. The known possibilities are thus cost-intensive solutions which require a complex circuit on the one hand and result in a restriction of the lift of the wanted signal for the voltage sensor.

For these and other reasons, there is a need for the present invention.

SUMMARY

An embodiment includes a rectifier circuit with a synchronously controlled semiconductor component. The rectifier circuit includes at least one field effect transistor with a control electrode and two switching electrodes. The control electrode controls the reverse state and the forward state between the switching electrode. For this, the rectifier circuit includes at least one driver which cooperates with a voltage sensor of the field effect transistor. In the diode operating state of the field effect transistor, the driver operates the field effect transistor into the forward state. The voltage sensor thereby forms at least one part of a non-linear voltage divider.

BRIEF DESCRIPTION OF THE FIGURES

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION OF THE EMBODIMENTS

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
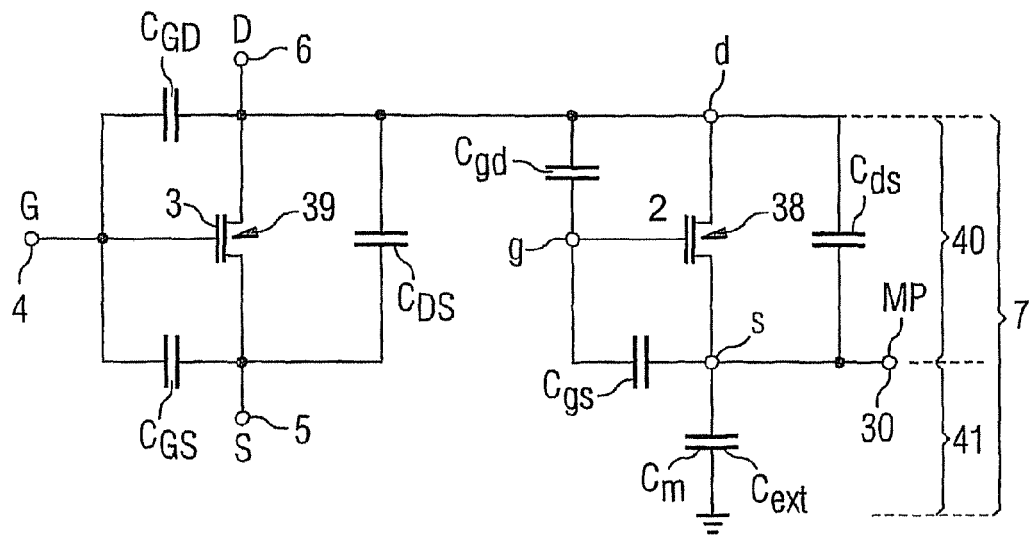
FIG. 1 illustrates an equivalent circuit diagram of a non-linear capacitive voltage divider with connection of a voltage sensor of a synchronous rectifier circuit in principle.

FIG. 1 illustrates an equivalent circuit diagram of a non-linear capacitive voltage divider 7 with connection of a voltage sensor 2 for a synchronous rectifier circuit. For this, the output capacitance Ca of a sensor region 38 is used as a non-linear high voltage capacitance, in which this output capacitance Ca is voltage-dependent and represents a parallel circuit of the voltage-dependent feedback capacitance Cgd and the voltage-dependent drain source capacitance Cds of the sensor region 38. The sensor region 38 includes a sensor source s, a sensor drain d and a sensor gate g and is monolithically integrated in a main transistor 39 which is a field effect transistor 3 of the synchronous rectifier circuit. If it is not bypassed by outside switching methods, the sensor region additionally includes a virtually voltage-independent gate source capacitance Cgs.

The main transistor 39 has a first 5 and a second switching electrode 6 in the form of a source S and a drain D of the field effect transistor 3. The main transistor 39 further includes a control electrode 4 in the form of the gate G of the field effect transistor 3 which controls the reverse state and the forward state of the field effect transistor 3.

For a low voltage tap 41, a voltage-independent measuring capacitance Cm is used, which is formed by an externally connected capacitance Cext, and which is connected between the mass and a measuring point MP of the non-linear capacitive voltage divider 7 in this embodiment. The voltage-dependent output capacitance Ca of a field effect transistor typically varies between 0 V and the maximum breakthrough voltage of the field effect transistor by approximately one magnitude. That is, if a measuring capacitance Cm with the magnitude of half the output capacitance Ca/2 applied of a sensor region 38 at 0 V is applied, ⅔ of the voltage drop is obtained during the diode operation of the field effect transistor, that is, approximately 0.5 V as voltage drop at the measuring capacitance Cm.

Figure 2:
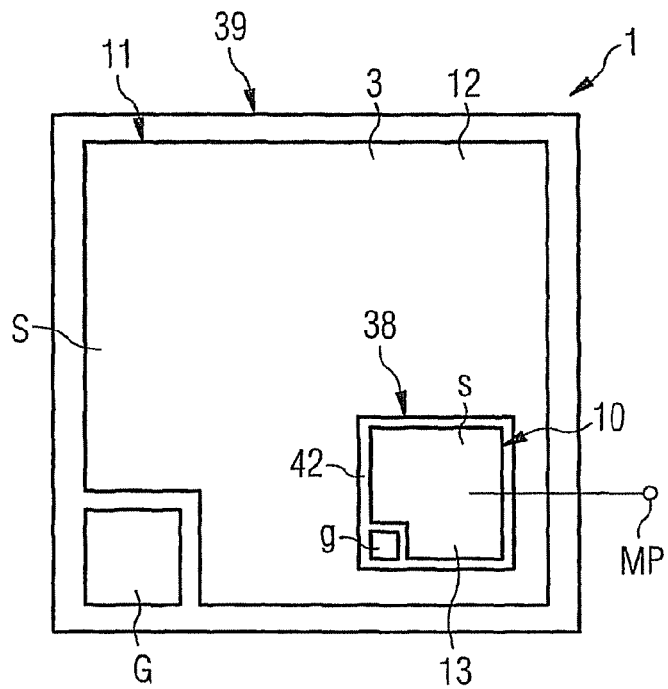
FIG. 2 illustrates a schematic plan view of a semiconductor component for a synchronous rectifier circuit according to FIG. 1.

FIG. 2 illustrates a schematic plan view of a semiconductor component 1 for a synchronous rectifier circuit according to FIG. 1. A common drain of d and D, as illustrated in FIG. 1 for the sensor region 38 or the main transistor 39, is arranged on the bottom side of a semiconductor chip as back side metallization, not visible here. The largest part of the upper side of the semiconductor which is visible here is taken up by the source metallization 12 of the cell field 11 of the field effect transistor 3 or the electrode of the source S of the main transistor 39. A smaller surface is reserved for the control electrode, the gate G of the field effect transistor 3. A part of the cell field 11 of the main transistor is provided for the monolithically integrated sensor region 38. This sensor cell field 10 is not different from the cell field 11 of the main transistor 39 in its semiconductor structure and is only separated electrically from the cell field by an insulation region 42 surrounding the sensor cell field 10.

Figure 3:
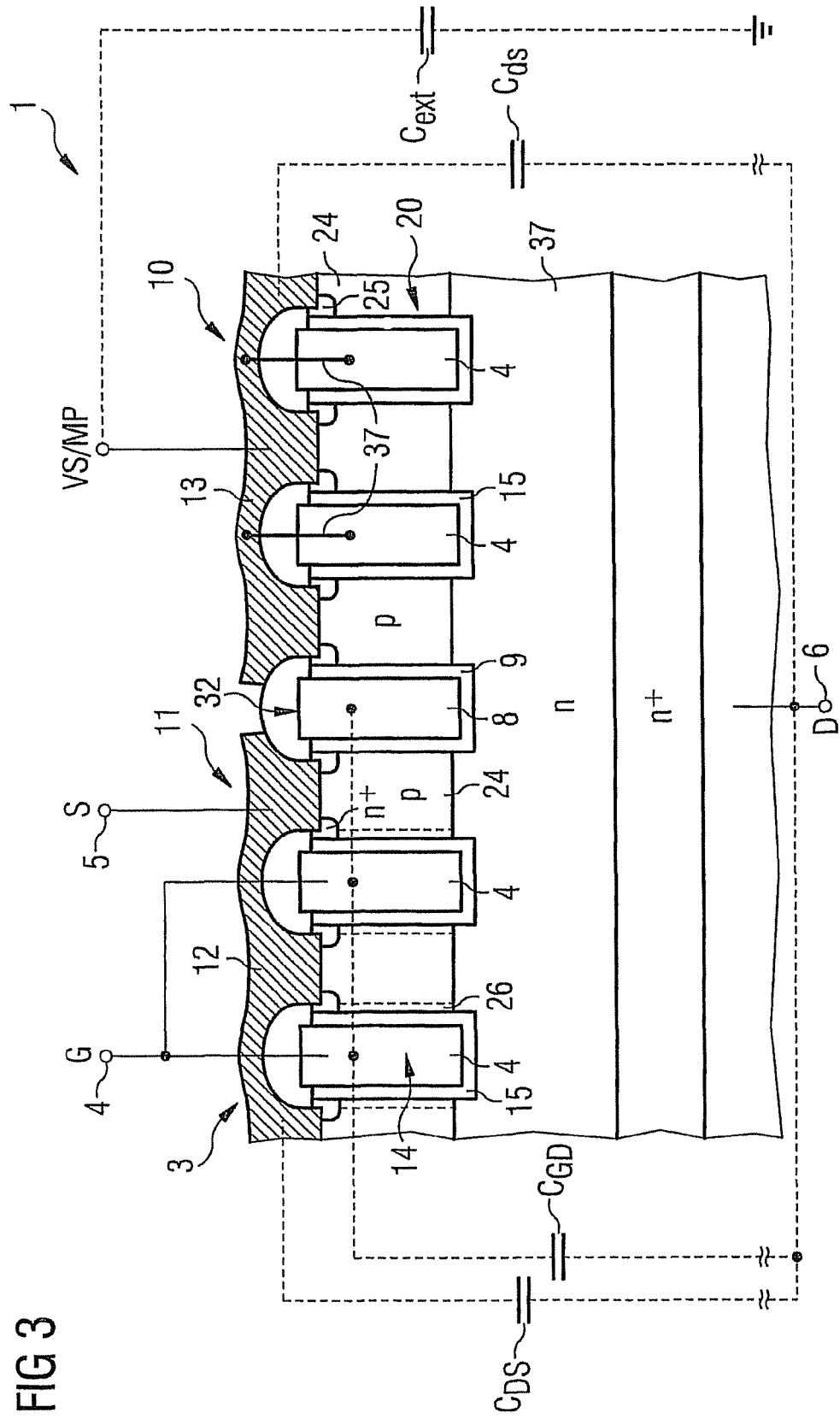
FIG. 3 illustrates a schematic cross section of a partial region of a field effect transistor for a synchronous rectifier circuit according to FIG. 1.

FIG. 3 illustrates a schematic cross section of a partial region of a semiconductor component 1 for a synchronous rectifier circuit according to FIG. 1. This partial region illustrates the sensor cell region 10 and the cell region 11 with active cells of the field effect transistor 3. Between the sensor cell region 10 and the cell region 11 is arranged a field plate trench 32 with a field plate 8 surrounding the sensor cell region 10, so as to insulate and shield the sensor cell region 10 from the cell field 11.

The sensor cell region 10 and the cell field 11 can in principle be manufactured simultaneously and with identical method processes. Only the source metallization is separated with the field plate 8 into a source metallization 12 of the cell field and a source metallization 13 of the sensor cell region 10 by the surrounding field plate trench 32. Thus, some of the cells of the field effect transistor 3 are executed as a separate sensor cell region 10 and have a separate source metallization 13.

In the region of the sensor cell region 13, the gate or the control electrode 4 of the trench gate structure 14 is bypassed with the source metallization 13, as illustrated by the connection lines 37. This prevents a floating of the gate or the control electrode 4 or an unintentional opening of the channel at a positive voltage at the gate relative to the source in the sensor cell region 10. The structure can be realized with classical trench gate cells or, as later illustrated in FIG. 11, also with field plate trenches and with a separate field electrode.

In this embodiment, p-wells for the body zones 24 of the sensor cell region 13 are electrically separated from the active cells of the field effect transistor 3. This electric separation is ensured by the above-mentioned surrounding field plate trench 32 or by a corresponding lip. The voltage sensor connection VS which is guided outwardly can thereby be connected to the source metallization 13 of the sensor cell region 10 as a measuring point MP. An access via the outer contact 30 illustrated in FIG. 1 is possible on this voltage sensor connection VS. In this embodiment according to FIG. 3, the dielectric of the monolithically integrated capacitance is formed partially by a gate oxide 15 of the trench gate structure 14 in the sensor cell region 10.

The low voltage which is present between the source S and the drain D during the conducting diode operating state of a body diode of the field effect transistor 3 is detected securely with the non-linear voltage divider 7. This is particularly useful with low voltage MOSFETs with a reverse capability between 20 and 200 Volts, especially as voltage peaks up to 100 V paired with very high dv/dt and di/dt values can occur in typical applications for example with an output of 12 V of a synchronous rectifier. These voltage peaks will not be effective at the measuring point MP by the non-linear voltage divider 7, so that measuring, control and/or driver ICs can be employed for the synchronous rectifier in a cost-effective manner with a correspondingly reduced reverse capability.

Figure 4:
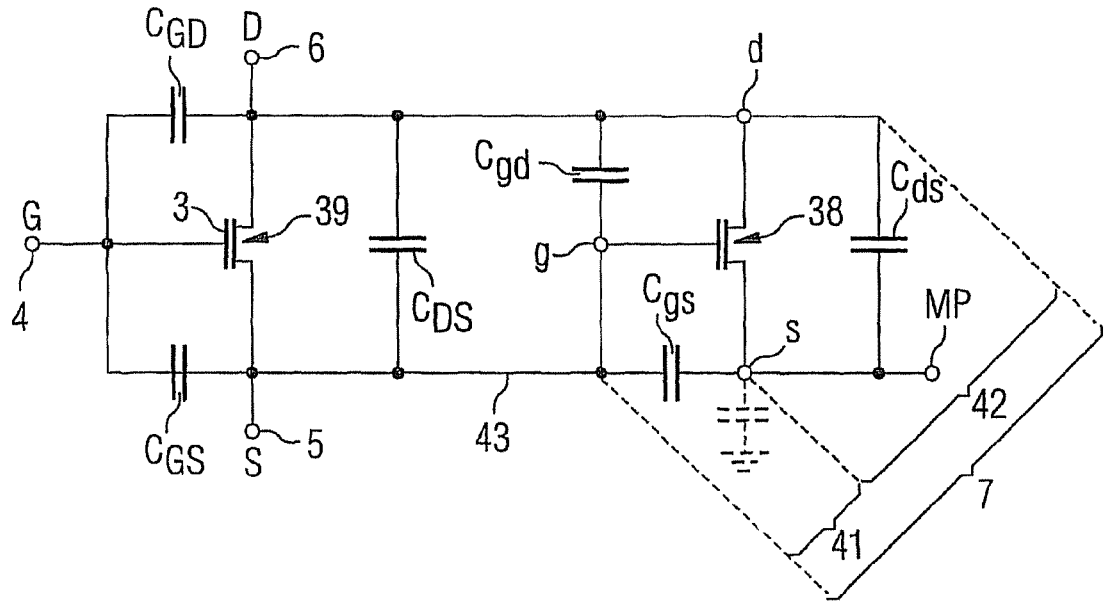
FIG. 4 illustrates an equivalent circuit diagram of a non-linear capacitive voltage divider with connection of a voltage sensor of a synchronous rectifier circuit in principle.

FIG. 4 illustrates an equivalent circuit diagram of a non-linear capacitive voltage divider 7 with connection to a voltage sensor of a synchronous rectifier circuit in principle. Components with the same functions as in the previous figures are characterized with the same reference numerals and are not mentioned especially. In this embodiment, a field effect transistor 3 also includes a sensor cell field as sensor region 38 with a separate sensor gate g insulated from the main transistor 39. The sensor output capacitance of the monolithically insulated sensor region 38 forms a voltage-dependent measuring capacitance of the non-linear voltage divider 7. However, the sensor gate g is electrically connected to the source S of the main transistor 39, so that the gate source capacitance Cgs of the sensor region 38 forms a virtually voltage-independent reference capacitance of the non-linear voltage divider 7.

This gate source capacitance Cgs is usually large enough with regard to the output capacitance of the sensor region 38, so as to form an effective non-linear voltage divider 7. For a low voltage tap 41, a voltage-independent external measuring capacitance can thus be forgone, which is formed by an externally connected capacitance Cext and which is connected between the mass and a measuring point MP of the non-linear capacitive voltage divider 7 in this embodiment. An additional external voltage-independent capacitance can optionally be connected in parallel, as characterized by the by the dashed lines in FIG. 4.

Figure 5:
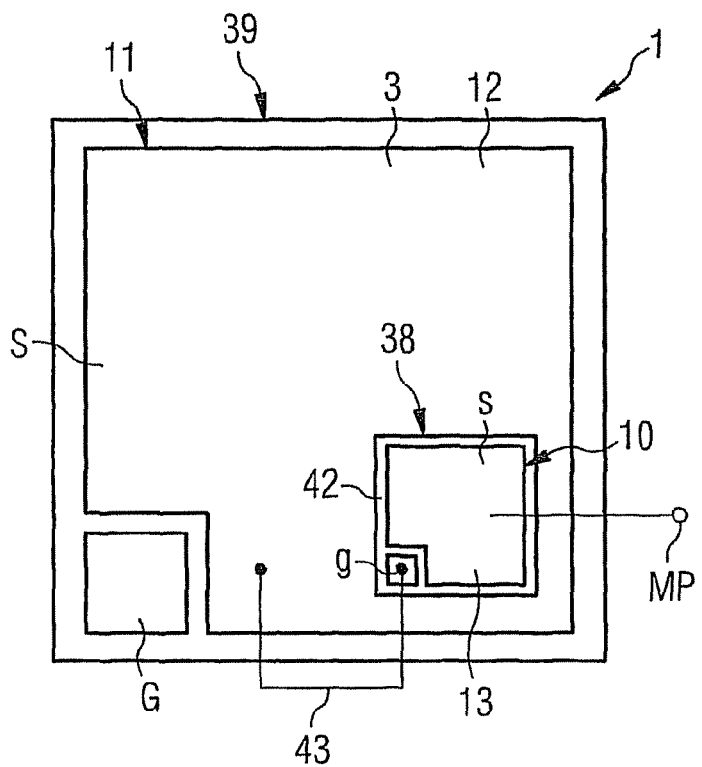
FIG. 5 illustrates a schematic plan view of a semiconductor component Of a synchronous rectifier circuit according to FIG. 4.

FIG. 5 illustrates a schematic plan view of a semiconductor component 1 for a synchronous rectifier circuit according to FIG. 4. In contrast to FIG. 2, the sensor gate g is electrically connected to the source S via a connection line 43.

Figure 6:
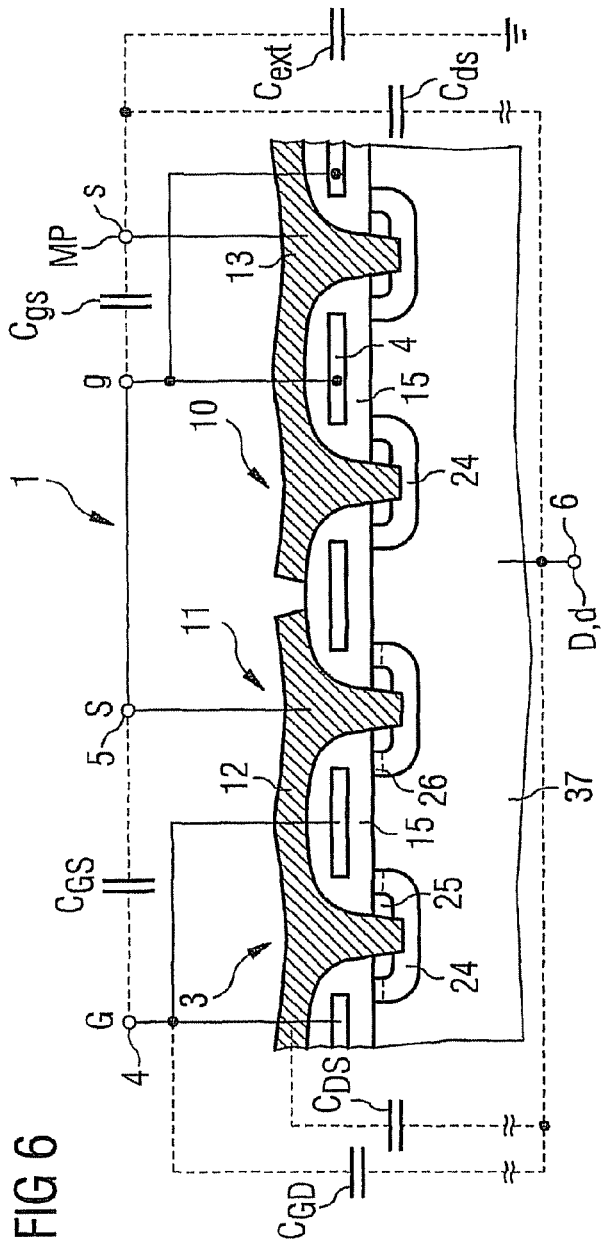
FIG. 6 illustrates a schematic cross section of a partial region of a field effect transistor for a synchronous rectifier circuit according to FIG. 4.

FIG. 6 illustrates a schematic cross section of a partial region of a field effect transistor 3 for a synchronous rectifier circuit according to FIG. 4. In this embodiment, the sensor cell region 10 and the cell field 11 of the field effect transistor 3 are formed with a lateral gate structure. In the sensor cell region 10, the lateral control electrodes 4 form a virtually voltage-independent capacitance with the source metallization 13 of the sensor cell region 10, which represents a reference capacitance for an entirely monolithically integrated voltage divider, so that an external capacitance is unnecessary.

Figure 7:
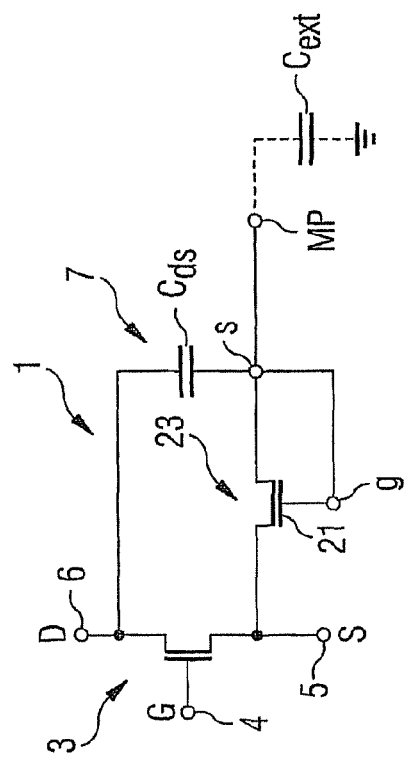
FIG. 7 illustrates an equivalent circuit diagram of a further possibility for voltage limitation in principle.

FIG. 7 illustrates an equivalent circuit diagram of a further possibility for the voltage limitation of the signal at the measuring point MP in principle. For this, the p-wells of the sensor region on the measuring potential have to be connected with an re-channel MOS transistor 21 in a self-regulating manner with the p-wells on the source potential of the main transistor 39. For this, the n-channel MOSFET 21 is arranged between the measuring point MP and the source connection S, and the gate of the re-channel MOSFET 21 is connected to the measuring point MP.

Figure 8:
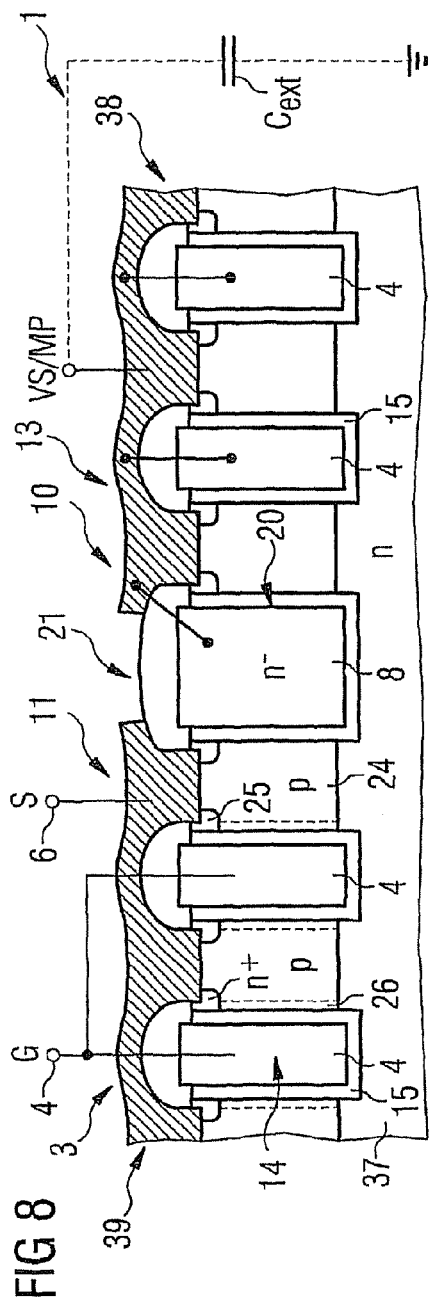
FIG. 8 illustrates a schematic cross section of a possible realization of the equivalent circuit diagram in principle according to FIG. 7.
Figure 9:
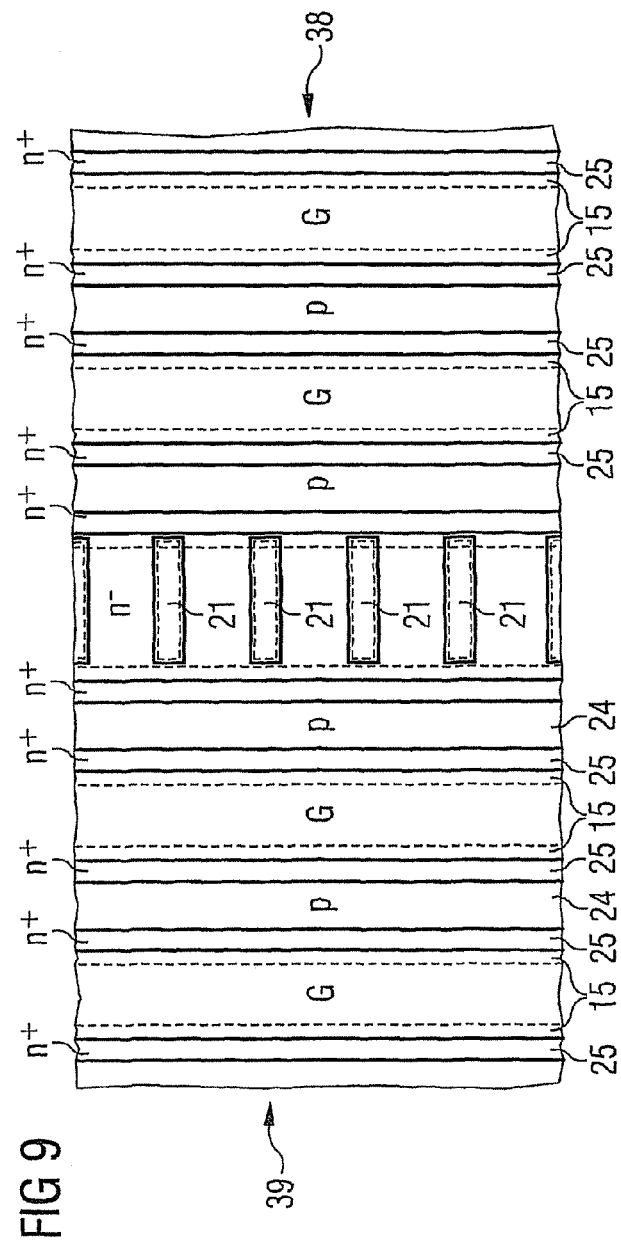
FIG. 9 illustrates a schematic plan view of a possible realization of the equivalent circuit diagram in principle according to FIG. 7.

FIG. 8 illustrates a schematic cross section for this and FIG. 9 illustrates a plan view of a possible realization in silicon. In the case of the trench gate technology illustrated in FIGS. 8 and 9, two spatially separated p-wells are connected to corresponding n+ source implantations via a trench, the gate metallization of which lies on the measuring point MP potential. Sidewall transistors are arranged between the sensor cell region 10 of the voltage sensor 2 and the cell field 11 of the main transistor 39 as voltage-limiting n-channel MOSFET 21, as illustrated by the plan view in FIG. 9.

It is further possible that the source metallization 13 of the sensor cell region 10 bypasses trench gate structures 14 and the field plate structures, so as to create a larger voltage-dependent monolithically integrated capacitance. The field plate trenches can also be executed with a field plate lying on the gate potential or as a planar technology. It is finally also possible that field plate structures are arranged in a floating manner in the sensor cell region and that trench gate structures are bypassed with the source metallization 13 of the sensor cell region.

Figure 10:
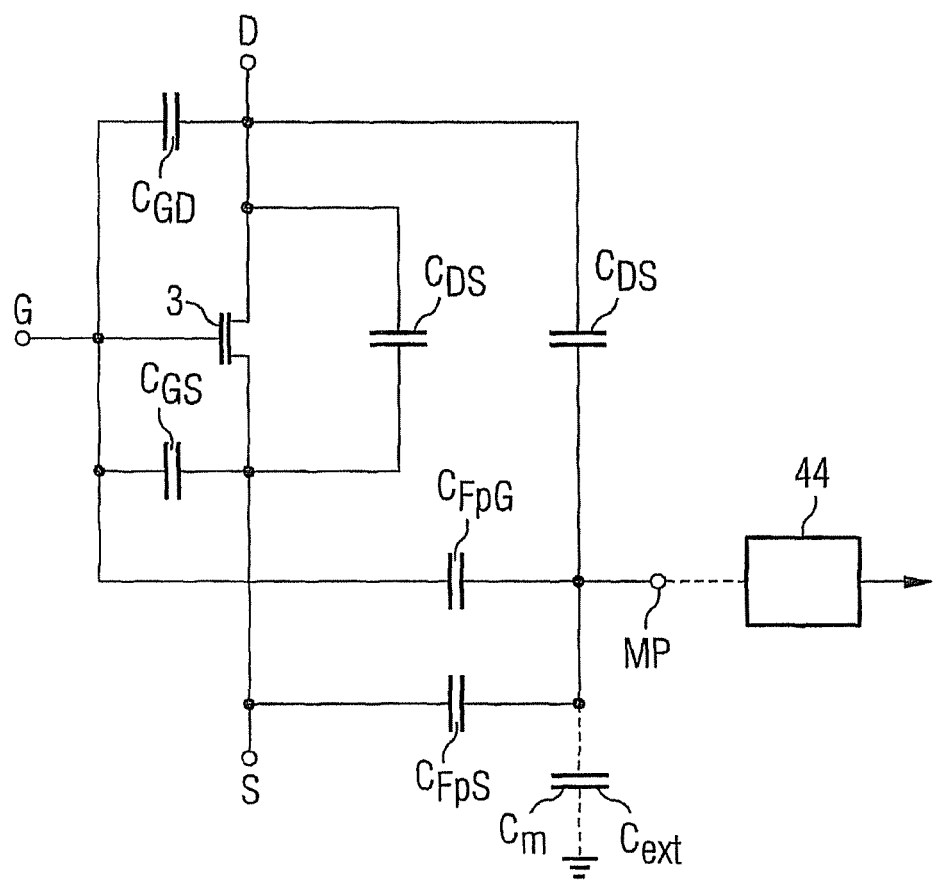
FIG. 10 illustrates an equivalent circuit diagram of a non-linear capacitive voltage divider for a synchronous rectifier circuit in principle.

FIG. 10 illustrates an equivalent circuit diagram of a non-linear capacitive voltage divider for a synchronous rectifier circuit of a further embodiment in principle. In this embodiment, no separate monolithically integrated sensor region is provided, but the capacitances of field plates of a field effect transistor 3 are used for the voltage sensor. The capacitances of the field plates of the field effect transistor 3 opposite the source CFpS, drain CFpD and gate CFpG are used as voltage-dependent non-linear high voltage capacitance of the non-linear capacitive voltage divider. A voltage-independent measuring capacitance CM is provided for a low voltage tap which is formed by an externally connected capacitance Cext and which is connected between the mass and a measuring point MP of the non-linear capacitive voltage divider in this embodiment.

With such a circuit in principle, negative drain source Voltages in low or medium voltage field effect transistors 3 in the region of for example between 6 V to 200 V can be realized with high precision. However, positive drain source voltages do not have to be measured.

Figure 11:
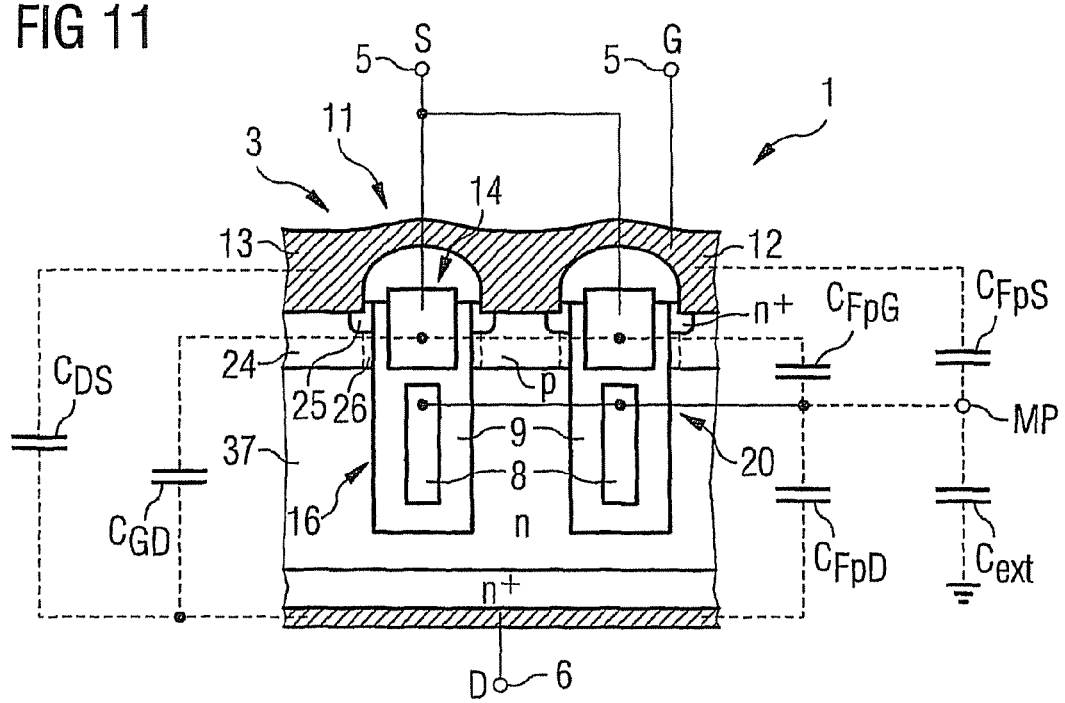
FIG. 11 illustrates a schematic cross section of a partial region of a field effect transistor with field plate structures for a synchronous rectifier circuit according to FIG. 10.

FIG. 11 illustrates a schematic cross section of a partial region of a field effect transistor 3 with field plate structures 16 for a synchronous rectifier circuit according to FIG. 10. Such a field plate structure 16 can be used to use the capacitances of the field plates of the field effect transistor 3 opposite the source CFpS, drain CFpD and gate CFpG as voltage-dependent non-linear high voltage capacitance of the non-linear capacitive voltage divider. The field plate oxide 9 and/or the gate oxide of a trench gate structure 14 illustrated here form the dielectric of the capacitances opposite the drain CFpD and/or gate CFpG or source CFpS, in which the measuring point MP for a non-linear voltage divider can be lead out of a housing as an external FP/VS connection, so as to be able to connect a voltage-independent reference capacitance for the non-linear voltage divider.

The field effect transistor 3 includes a trench gate structure 14 in this cross sectional view next to the field plates 8 in the field plate structure 16, which is arranged in the same trench structure 20 as the field plates 8. The trench gate structures 14 of the cell field 11 of the field effect transistor 3 are connected together as a control electrode 4 as the gate G of the field effect transistor 3. A source metallization 13 of the first switching electrode 5, which is formed as a source S, contacts p-conducting body zones 24 and highly-doped n+-conducting source zones 25. When a corresponding control voltage is present at the control electrode 4, channels 26 are formed in the body zones 24 between the source zones 25 and the n-conducting drift zones 27, which enables a connection from the first switching electrode 5 to the second switching electrode 6, which here represents a drain electrode 6 of the drain D.

The measuring point MP cooperates with a measuring, control and/or driver IC 44, as illustrated in the equivalent circuit diagram 10 in principle. The measuring point MP of the non-linear voltage divider can be lead out from a standard housing of a power MOSFET as the connection FP/VS, as illustrated in FIG. 12.

The field plate electrode 8 has a significant overlap with the drain D via its field oxide structure and can thus be used as voltage sensor. The field plate electrode 8 furthermore possesses a highly non-linear characteristic by its position deep in the space charging zone region of the drift passage, so that, when high reverse voltages of the potential are present at the field plate sensor, a low positive voltage can be achieved during switching with an external capacitances Cext via the measuring point MP. This is important, as, when positive voltages are present which are too high, the breakdown voltage of the field effect transistor is influenced in a negative manner. The closing resistor of the transistor is not influenced in a negative manner by the field plate voltage sensor, the gate electrode and the channel region remain unaffected. Thus, no separate chip surfaces for a voltage sensor region are necessary for this embodiment.

When the field plate electrode 8 is used only partially as voltage sensor, the breakthrough voltage of the region used as the voltage sensor is sometimes increased compared to the main transistor surface. This can for example take place by reducing the measuring width between the trench structures. But this only has to be used when the voltage sensor surface is noticeably smaller than the main transistor. Otherwise, the breakthrough voltage of the main transistor has to be increased compared to the one of the voltage sensor.

Figure 12:
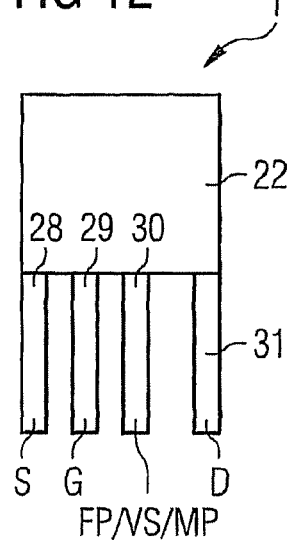
FIG. 12 illustrates a schematic plan view of a semiconductor component with a field effect transistor according to FIG. 11 in a housing, and with outer connections.

FIG. 12 illustrates a schematic plan view of a semiconductor component with a field effect transistor according to FIG. 11 in a housing, and with outer connections 28 29, 30 and 31. The outer connection 28 is thereby in contact with the source electrode S of the field effect transistor within the housing 22, the outer connection 29 contacts the control electrode or the gate G of the field effect transistor in the housing 22 and the outer connection 31 contacts the drain electrode D of the field effect transistor. The field plate connection FP/VS of the measuring point MP is arranged between the gate G and the drain D connection. This outer contact FP/VS is in electrical connection with the field plates within the field effect transistor. A voltage-independent reference capacitance can be connected to this connection, so as to realize a non-linear voltage divider. One advantage of this embodiment is that, no additional semiconductor chip surface is required for the construction of a non-linear voltage divider in principle. Rather, the field plates typically on source potential which are present in the field plate transistor 3 and which can be contacted, are partially or entirely used as voltage sensor on the entire semiconductor chip surface.

Alternatively, the voltage at the monolithically integrated sensor can be limited effectively by a n-channel MOSFET forward a source and sensor as illustrated in the above FIG. 7, or by a diode, as illustrated in the following FIG. 13.

Figure 13:
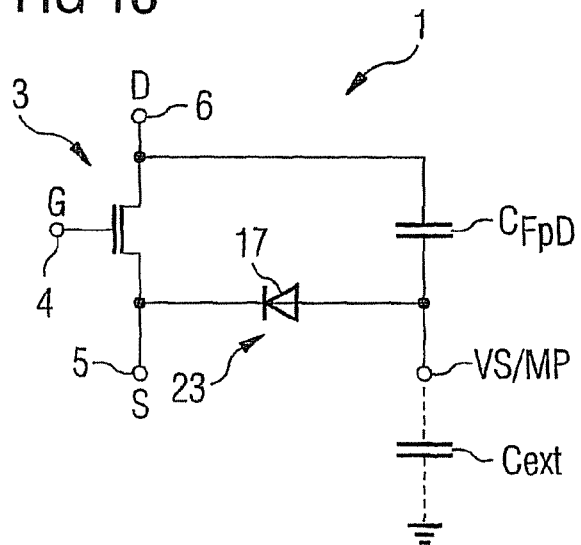
FIG. 13 illustrates a simplified equivalent circuit diagram of a semiconductor component for a synchronous rectifier circuit in principle.

FIG. 13 illustrates a simplified equivalent circuit diagram of a semiconductor component in principle, which is provided for a synchronous rectifier circuit and includes a voltage sensor connection VS having an overload protection. Although a non-linear voltage divider is already realized by the voltage-dependent field plate capacitance CFpD and the external voltage-independent reference capacity, the above-mentioned danger of a reduction of the breakthrough stability of the field effect transistor 3 is removed by the diode 17 which is clamped between the source and the field plate electrode. In addition, this diode 17 should ensure that the potential at the measuring point MP remains negative and that the voltage present at the measuring point MP is clamped to 2 to 3 volts.

Figure 14:
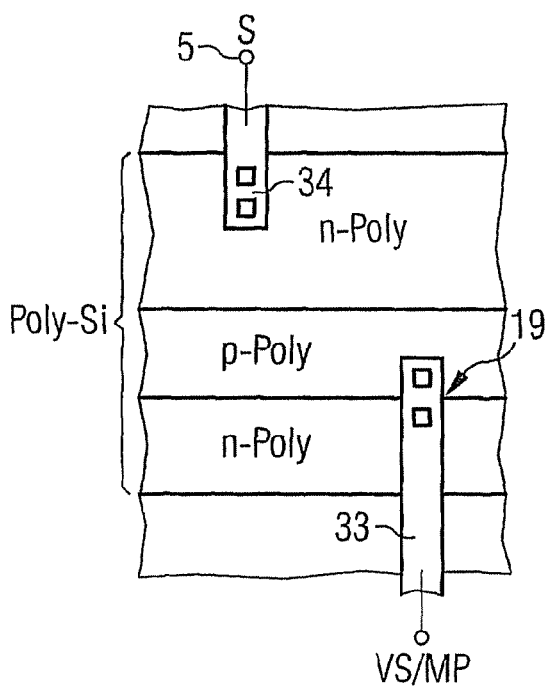
FIG. 14 illustrates a schematic plan view of a monolithically integrated overvoltage protection diode of polysilicon.

Such a diode 17 can be arranged between the field plate electrode and the metallic contact of the source S of the main transistor, as illustrated in FIG. 14.

FIG. 14 illustrates a schematic plan view of a monolithically integrated overvoltage protection diode 19 of polysilicon. For this, the outer connection VS for the voltage sensor is guided via a metallic conductor 33 to a p-conducting poly region which is applied to the semiconductor body which abuts an n-conducting polysilicon region. The n-polyregion also includes a metallic conductor 34 which is in electrical connection with the source S.

Figure 15:
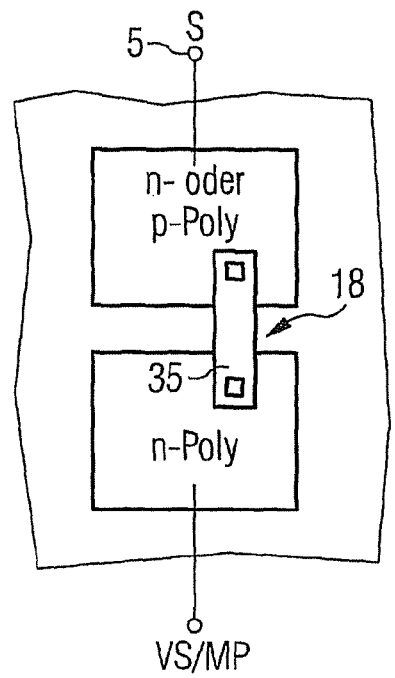
FIG. 15 illustrates a schematic plan view of a monolithically integrated excess voltage protection diode of polysilicon.

The diode 17 illustrated in FIG. 13 can be realized as a Schottky diode between the field plate electrode and the metallic contact to the source S of the main transistor, as illustrated in FIG. 15.

FIG. 16 illustrates a schematic plan view of an alternative solution, where a Schottky contact 36 is used as overvoltage diode. For this, the Schottky diode 18 can be integrated in a contact hole for contacting the gate electrode. The outer contact VS is thereby connected to the voltage sensor and is connected to a metallic lead 35 by an ohmic conductor. This metallic lead 35 forms a Schottky contact into an n-conducting or p-conducting poly region which is in connection with the first switching electrode 5 or with the source S.

Such a diode 17 can alternatively also be provided in a control, driver or measuring IC 44, as illustrated in FIG. 10.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A rectifier circuit having a synchronously controlled semiconductor element, comprising:
   at least one field effect transistor with a control electrode and two switching electrode, in which the control electrode operates the reverse state and the forward state between the switching electrodes;
   at least one driver, which cooperates with a voltage sensor of the field effect transistor and controls this to the forward state with a conducting diode operating state of the field effect transistor; and
   wherein the field effect transistor comprises a cell field insulated from a main transistor as voltage sensor with a separate sensor gate and a separate sensor source, and in which a sensor output capacitance of the monolithically insulated sensor forms a non-linear voltage divider with an external reference capacitance.

2. The rectifier circuit of claim 1, wherein the output capacitance of the voltage sensor forms a high voltage tap of the voltage divider and an external voltage-independent capacitance forms a low voltage tap of the voltage divider.

3. The rectifier circuit of claim 1, wherein the output capacitance of the monolithically integrated voltage sensor comprises a sensor cell region which is arranged in an insulated manner from a cell field of the field effect transistor.

4. The rectifier circuit of claim 3, wherein the sensor cell region is surrounded by a field plate trench.

5. The reectifier circuit of claim 3, wherein the source metallization of the sensor cell region is electrically connected to a trench gate structure.

6. The rectifier circuit of claim 1, wherein the capacitance of the monolithically integrated voltage sensor partially comprises a gate oxide of the sensor cell region as dielectric.

* * * * *

UNITED STATES PATENT AND TRADEMARK OFFICE
CERTIFICATE OF CORRECTION

| | | |
|---|---|---|
| PATENT NO. | : 8,634,215 B2 | Page 1 of 1 |
| APPLICATION NO. | : 13/419623 | |
| DATED | : January 21, 2014 | |
| INVENTOR(S) | : Deboy | |

It is certified that error appears in the above-identified patent and that said Letters Patent is hereby corrected as shown below:

In the Claims

Claim 5, Column 8, line 51, delete "reectifier" and insert in place thereof --rectifier--.

Signed and Sealed this
Sixteenth Day of September, 2014

Michelle K. Lee
*Deputy Director of the United States Patent and Trademark Office*